United States Patent
Oh et al.

(10) Patent No.: US 9,136,872 B2
(45) Date of Patent: Sep. 15, 2015

(54) MEMORY, MEMORY SYSTEM, AND ERROR CHECKING AND CORRECTING METHOD FOR MEMORY

(71) Applicant: Samsung Electronics Co., Ltd., Suwon-Si, Gyeonggi-Do (KR)

(72) Inventors: Eun-chu Oh, Hwaseong-si (KR); Jae-hong Kim, Seoul (KR); Jun-jin Kong, Gyeonggi-do (KR)

(73) Assignee: SAMSUNG ELECTRONICS CO., LTD., Gyeonngi-Do (KR)

( * ) Notice: Subject to any disclaimer, the term of this patent is extended or adjusted under 35 U.S.C. 154(b) by 33 days.

(21) Appl. No.: 13/648,421

(22) Filed: Oct. 10, 2012

(65) Prior Publication Data

US 2013/0198577 A1 Aug. 1, 2013

(30) Foreign Application Priority Data

Jan. 30, 2012 (KR) ........................ 10-2012-0009207

(51) Int. Cl.
| | |
|---|---|
| *G06F 11/00* | (2006.01) |
| *H03M 13/05* | (2006.01) |
| *H03M 13/35* | (2006.01) |
| *H03M 13/37* | (2006.01) |
| *H03M 13/11* | (2006.01) |

(52) U.S. Cl.
CPC ............ *H03M 13/05* (2013.01); *H03M 13/356* (2013.01); *H03M 13/3707* (2013.01); *H03M 13/1102* (2013.01)

(58) Field of Classification Search
CPC ........... H04L 1/20; H04L 1/24; H04L 1/0061; G06F 11/076; G01R 31/3171
USPC .......................................................... 714/704
See application file for complete search history.

(56) References Cited

U.S. PATENT DOCUMENTS

| | | | | |
|---|---|---|---|---|
| 5,255,367 | A | * 10/1993 | Bruckert et al. | ................ 714/11 |
| 5,381,544 | A | 1/1995 | Okazawa et al. | |
| 7,502,921 | B2 | 3/2009 | Tomlin et al. | |
| 7,900,118 | B2 | 3/2011 | Chang et al. | |
| 7,975,205 | B2 | 7/2011 | Thayer | |
| 8,788,889 | B2 * | 7/2014 | Jeon et al. | ...................... 714/701 |
| 2005/0055621 | A1 * | 3/2005 | Adelmann et al. | ............. 714/758 |
| 2006/0149890 | A1 * | 7/2006 | Gorobets | ....................... 711/103 |
| 2009/0017844 | A1 | 1/2009 | Li et al. | |
| 2009/0172498 | A1 | 7/2009 | Shlick et al. | |
| 2009/0276609 | A1 * | 11/2009 | Moyer et al. | ................... 712/220 |

FOREIGN PATENT DOCUMENTS

| | | | |
|---|---|---|---|
| EP | 1261973 | B1 * | 9/2010 |
| JP | 2000020397 | A | 1/2000 |
| JP | 2008158779 | A | 7/2008 |
| KR | 20090017844 | A | 2/2009 |
| KR | 20090021743 | A | 3/2009 |

* cited by examiner

*Primary Examiner* — Albert Decady
*Assistant Examiner* — Enam Ahmed
(74) *Attorney, Agent, or Firm* — Harness, Dickey & Pierce, P.L.C.

(57) ABSTRACT

A memory system includes an error checking and correction (ECC) engine configured to perform error checking and correction of data temporarily stored in a first memory array and data read out from the first memory array according to a first method, and perform error checking and correction of data stored in a second memory array after read out from the first memory array and data read out from the second memory array according to a second method, wherein the first method and the second method are selected in response to a control signal having at least a first logic level, and the second method checks and corrects data errors occurring at a higher rate compared the first method.

17 Claims, 15 Drawing Sheets

MEMORY, MEMORY SYSTEM, AND ERROR CHECKING AND CORRECTING METHOD FOR MEMORY

CROSS-REFERENCE TO RELATED APPLICATIONS

This application claims the benefit of Korean Patent Application No. 10-2012-0009207, filed on Jan. 30, 2012, in the Korean Intellectual Property Office, the disclosure of which is incorporated herein in its entirety by reference.

BACKGROUND

The inventive concepts relate to a memory, a memory system, and/or an error checking and correcting method for a memory, and more particularly, to a memory, a memory system, and/or an error checking and correcting method of a memory optimized to a scheme applied to a flash memory for improving reliability of the flash memory and reducing power consumption and latency of the flash memory.

Flash memories have been scaled down and the number of bits stored in each of memory cells has been increased. Therefore, a read margin between program states has been decreased, and thus, a read error occurs frequently. Therefore, solutions for accurately and efficiently checking for and correcting errors have been explored.

SUMMARY

The inventive concepts provide a memory, a memory system, and/or an error checking and correcting method of a memory for improving reliability of a flash memory and reducing power consumption and latency.

According to at least one example embodiment, a memory system includes an error checking and correction (ECC) engine configured to perform error checking and correction of data temporarily stored in a first memory array and data read out from the first memory array according to a first method, and perform error checking and correction of data stored in a second memory array after reading out data from the first memory array and data read out from the second memory array according to a second method, wherein the ECC engine is configured to perform the first method and the second method in response to a control signal having at least a first logic level, and an error correcting capability of the second method is greater than an error correcting capability of the first method.

According to at least one example embodiment, the ECC engine is configured to check and correct errors of n bits according to the first method, where n is a natural number, and the ECC engine is configured to check and correct errors with respect to m bits according to the second method, where m is a natural number greater than n.

According to at least one example embodiment, the ECC engine includes a first sub-engine configured to check and correct errors of data stored in and read out from the first memory array according to the first method; and a second sub-engine configured to check and correct errors of data stored in and read out from the second memory array according to the second method.

According to at least one example embodiment, while the second sub-engine is configured to perform an ECC encoding of first data to be stored in the second memory array or an ECC decoding of the first data read out from the second memory array, the first sub-engine is configured to perform an ECC encoding of second data to be stored in the first memory array or an ECC decoding of the second data read out from the first memory array.

According to at least one example embodiment, the memory system further includes: a memory controller; and a memory, wherein the ECC engine includes an external ECC engine in the memory controller, the external ECC engine configured to perform an ECC encoding of data of the first memory array according to the first method and an ECC decoding of data of the second memory array according to the second method; and an internal ECC engine in the memory, the internal ECC engine configured to perform an ECC decoding of data of the first memory array according to the first method and an ECC encoding of data of the second memory array according to the second method.

According to at least one example embodiment, design complexity of the internal ECC engine is lower than that of the external ECC engine.

According to at least one example embodiment, the memory system further includes a ECC control unit configured to generate the control signal, the ECC control unit being configured to generate the control signal at the first logic level if a value indicating a deterioration state of the first memory array is less than a reference value, and the first logic level of the control signal corresponds to a flag indicating to which of the first memory array and the second memory array memory array data is to be programmed.

According to at least one example embodiment, the ECC control unit is configured to determine the deterioration state of the first memory array based on a program/erase (P/E) cycle, retention time, or bit error rate (BER) of the first memory array.

According to at least one example embodiment, the memory system further includes a ECC control unit configured to generate the control signal, and if a value indicating a deterioration state of the first memory array is greater than a reference value, then the ECC control unit is configured to generate the control signal at a second logic level different from the first logic level, and in response to the second logic level of the control signal, the ECC engine sets the second method to be the same as the first method.

According to at least one example embodiment, the memory system further includes a ECC control unit configured to generate the control signal, and if a value indicating a deterioration state of the second memory array is greater than a reference value, the ECC control unit is configured to generate the control signal at a second logic level different from the first logic level, and in response to the second logic level of the control signal, the ECC engine sets the second method to be the same as the first method.

According to at least one example embodiment, a number of bits of data stored in each of memory cells of the first memory array is less than a number of bits of data stored in each of memory cells of the second memory array.

According to at least one example embodiment, the first memory array and the second memory array are vertical NAND flash memories.

According to at least one example embodiment, the first memory array and the second memory array are arranged on a same physical layer or on different physical layers.

According to at least one example embodiment, a NAND flash memory device includes an internal error checking and correction (ECC) engine configured to perform ECC decoding for checking and correcting errors on data temporarily stored in a first memory array and data read out from the first memory array according to a first method, and perform ECC encoding for checking and correcting errors on data stored in a second memory array after read out from the first memory array and data read out from the second memory array according to a second method, wherein an error correcting capability of the second method is greater than an error correcting capability of the first method.

According to at least one example embodiment, the first memory array and the second memory array are vertical NAND flash memories.

According to at least one example embodiment, A memory system includes a memory including a first memory array and a second memory array; and an error checking and correction (ECC) engine configured to perform error checking and correction of first data in the first memory array to generate corrected first data, and perform error checking and correction of the corrected first data in the second memory array to generate corrected second data, the ECC engine being configured to output final decoded data based on the corrected second data.

According to at least one example embodiment, the memory system further includes a control unit configured to apply a control signal to the ECC engine to control the ECC engine, the control unit being configured to apply the control signal based on at least one of a mode signal and an environment signal, the mode signal indicating a method of error checking and correction for the first and second data, and the environment signal indicating at least one of whether a number of program/erase (PIE) cycles is less than a first reference value and whether a bit error rate (BER) is less than a second reference value.

According to at least one example embodiment, the first data is 'n' number of bits and the second data is 'm' number of bits, and if 'm' is greater than 'n,' then the ECC engine is configured to apply different error checking and correction methods for the first data and the second data in response to the control signal.

According to at least one example embodiment, if 'm' is equal to 'n,' then the control unit is configured to determine error checking and correction methods for the first data and the second data based on the environment signal.

According to at least one example embodiment, if 'm' is equal to 'n,' then the first data includes a least significant bit of a data line, and the second data includes a most significant bit of the data line.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
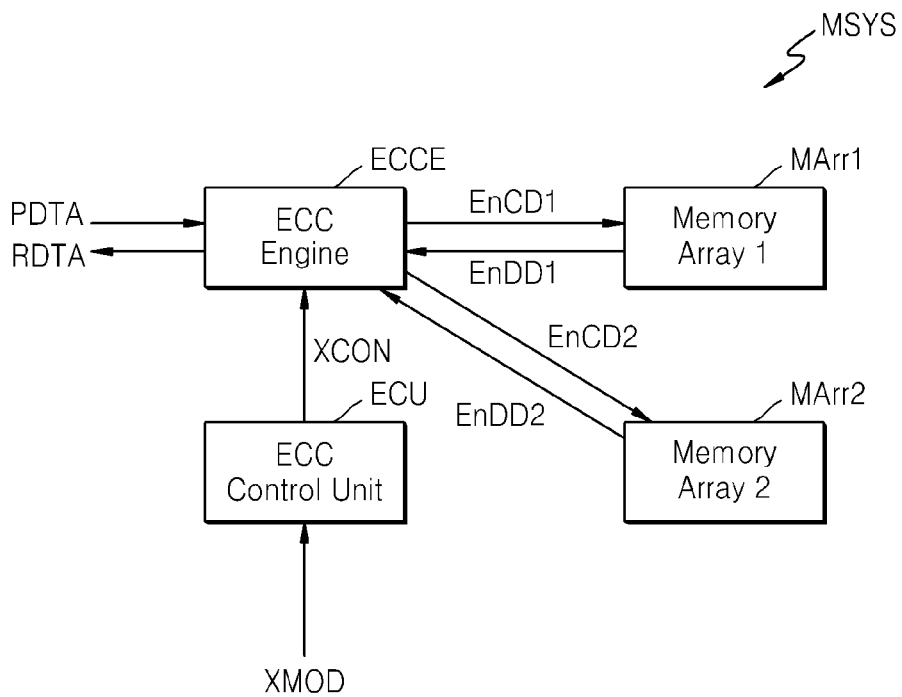
FIG. 1 is a block diagram of a flash memory system according to at least one example embodiment of the inventive concepts.

These example embodiments are provided so that this disclosure will be thorough and complete, and will fully convey the concept of the inventive concept to those skilled in the art. The inventive concepts may, however, be embodied in many different forms and should not be construed as being limited to the example embodiments set forth herein.

The terminology used herein is for the purpose of describing particular example embodiments only and is not intended to be limiting of the inventive concepts. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The inventive concept now will be described more fully hereinafter with reference to the accompanying drawings, in which illustrative example embodiments of the inventive concepts are shown. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

FIG. 1 is a block diagram of a flash memory system MSYS according to at least one example embodiment of the inventive concepts.

Referring to FIG. 1, the flash memory system MSYS includes a first memory array MArr1, a second memory array MArr2, an error checking and correcting (ECC) engine ECCE, and an ECC control unit ECU. The first memory array MArr1 and the second memory array MArr2 store program data PDTA. Particularly, if it is necessary to store data for a desired (or alternatively, predetermined) period of time for optimal write performance or for using various program schemes, such as coarse-fine programming, the first memory array MArr1 may be a memory array for temporarily storing program data PDTA to be programmed to the second memory array MArr2. Therefore, the first memory array MArr1 may feature faster access speed, faster write speed, or faster reading speed as compared to the second memory array MArr2.

In the flash memory system MSYS according to at least one example embodiment, programming may be performed using the coarse-fine programming method as described above. In this case, an on-chip buffered programming method may be employed to reduce coupling noise between cells. According to the on-chip buffered programming method, the flash memory system MSYS may coarsely program a program cell with a first data and program an adjacent cell with a second data different from the first data. The adjacent cell inflicts a coupling effect to the program cell. The flash memory system MSYS may then finely program the program cell for adjusting a threshold voltage.

For example, in the flash memory system MSYS according at least one example embodiment, data of a cell, which is only coarsely programmed, may be written to the first memory array MArr1, e.g., an on-chip buffer, and, for fine programming, data from the first memory array MArr1 may be read and the read-out data may be written to the second memory array MArr2.

Furthermore, in the flash memory system MSYS according to at least one example embodiment, a flash memory (e.g., MEM of FIG. 3) may receive data from an external device even while data is being programmed to the flash memory, and thus, after the programming operation is completed, a next programming operation may be performed without a delay. Examples of the external devices may include a host, a buffer manager, or a memory controller. The programming method may be referred to as a cache programming method. The flash memory system MSYS may perform the operations described above by reading data programmed to the first memory array MArr1 and writing the read-out data to the second memory array MArr2.

Figure 2:
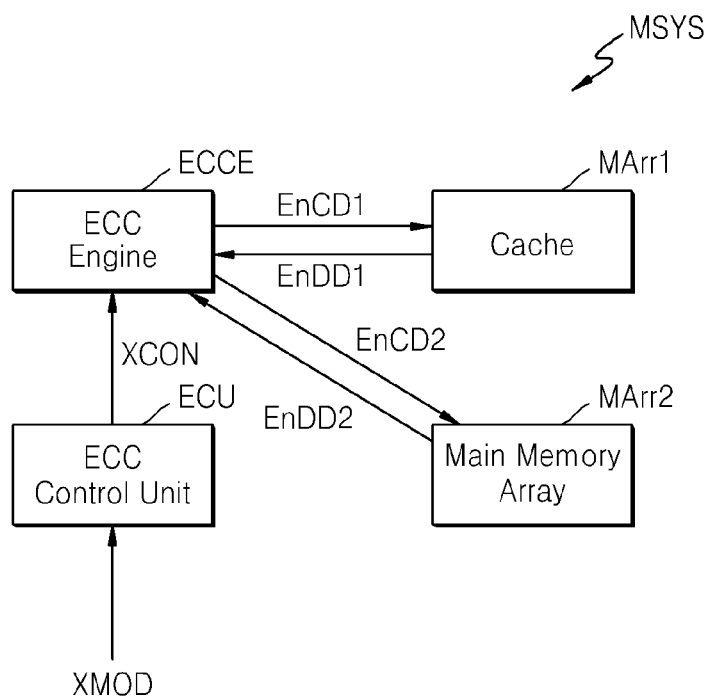
FIGS. 2 and 3 are diagrams showing examples of the flash memory system of FIG. 1.

Examples of the first memory array MArr1 and the second memory array MArr2 will be described below. For example, as shown in FIG. 2, the first memory array MArr1 may be a cache memory, whereas the second memory array MArr2 may be a main memory array. For example, the first memory array MArr1 may be a cache memory including a NAND flash memory, and the second memory array MArr2 may be a main memory array including a NAND flash memory. If the second memory array MArr2 includes a multi-level cell (MLC) NAND flash memory, the first memory array MArr1 may function as a cache (i.e., a buffer) which is programmed in single-level cell (SLC) method with a fast programming/reading-out speed. A memory system according to at least one example embodiment of the inventive concepts may be programmed using an on-chip buffered programming method or cache programming method, wherein the cache memory may function as an on-chip buffer or as a cache.

Alternatively, the first memory array MArr1 may be a multi-level cell NAND flash memory in which smaller number of bits are programmed to each of cells as compared to the second memory array MArr2. For example, the first memory array MArr1 may be a 2-bit multi-level cell NAND flash memory, whereas the second memory array MArr2 may be a 3-bit multi-level cell NAND flash memory.

Alternatively, the first memory array MArr1 and the second memory array MArr2 may be multi-level cell NAND flash memories in which a same number of bits are programmed to each of cells. For example, both the first memory array MArr1 and the second memory array MArr2 may be 3-bit multi-level cell NAND flash memories. However, in this case, the first memory array MArr1 may store a least significant bit (LSB), whereas the second memory array MArr2 may store a most significant bit (MSB). In other words, the first memory array MArr1 stores data including a least significant bit of a data line, and the second memory array MArr2 stores data including a most significant bit of the data line.

Alternatively, the first memory array MArr1 may include a cache memory embodied by a DRAM, an MRAM, or a PRAM, whereas the second memory array MArr2 may include a NAND flash memory.

Alternatively, the first memory array MArr1 and the second memory array MArr2 may be embodied as different blocks (e.g., units for erasing) in a flash memory. Alternatively, the first memory array MArr1 and the second memory array MArr2 may be embodied as units to which different voltages are applied or units connected to different common source lines in a flash memory.

However, the inventive concepts are not limited thereto. Furthermore, more detailed descriptions of various embodiments of the first memory array MArr1 and the second memory array MArr2 will be given later.

Referring back to FIG. 1, data stored in the first memory array MArr1 and the second memory array MArr2 may contain errors. For example, data stored in the first memory array MArr1 and the second memory array MArr2 may have values different from those of the program data PDTA that was supposedly programmed in these arrays.

Figure 3:
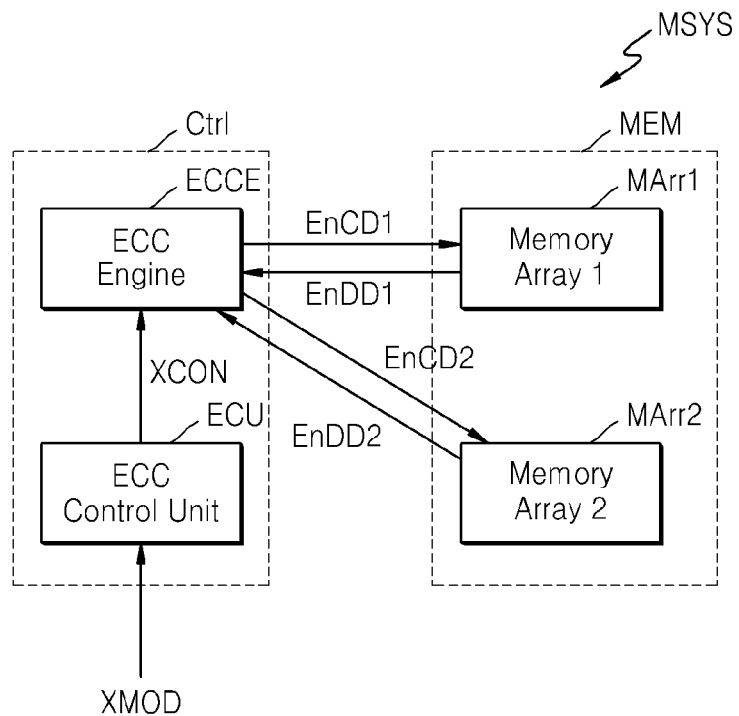

The flash memory system MSYS of FIG. 1 may include a memory and a memory controller. For example, as shown in FIG. 3, the flash memory system MSYS may include a memory MEM including the first memory array MArr1 and the second memory array MArr2 and a memory controller Ctrl including the ECC engine ECCE and the ECC control unit ECU.

The ECC engine ECCE checks for and corrects data errors. In detail, the ECC engine ECCE generates first encoded data EnCD1 by encoding the program data PDTA stored in the first memory array MArr1 by using a first method. The first encoded data EnCD1 may be transmitted to the first memory array MArr1. The ECC engine ECCE checks for and corrects errors of data programmed to the first memory array Marr1 by using first decoded data EnDD1 generated by decoding the first encoded data EnCD1 received from the first memory array MArr1 by using the first method. For example, the ECC engine ECCE may encode the program data PDTA to be stored in the first memory array MArr1, generate the first encoded data EnCD1, such as parity data, and store the first encoded data EnCD1 in the first memory array MArr1. Next, the ECC engine ECCE may check for errors in data read out from the first memory array MArr1 based on the first decoded data EnDD1 generated by decoding the first encoded data EnCD1 and may correct the errors by performing an exclusive OR operation on error bits.

In FIG. 1 and the following drawings, although it is shown that the first decoded data EnDD1 is transmitted from the first memory array MArr1 to the ECC engine ECCE, as described above, the first decoded data EnDD1 is a result of decoding the first encoded data EnCD1 transmitted from the first memory array MArr1 as described above. However, to express that the first encoded data EnCD1 is generated with respect to data to be stored in the first memory array MArr1 and the ECC engine ECCE generates the first decoded data EnDD1 with respect to data read out from the first memory array MArr1, the first decoded data EnDD1 is attached to a path of transmitting data read out from the first memory array MArr1 (the arrow mark). The same applies to the second decoded data EnDD2 described below.

The ECC engine ECCE generates second encoded data EnCD2 by encoding data, which is read out from the first memory array MArr1 and is error-checked and corrected, by using a second method and transmits the second encoded data EnCD2 to the first memory array MArr1. Next, the ECC engine ECCE checks and corrects errors included in data read out from the second memory array Marr2 based on second decoded data EnDD2 that is generated by decoding the second encoded data EnCD2. The data that is read out from the second memory array MArr2 and is error-checked and corrected may be output as read-out data RDTA.

The ECC engine ECCE is not limited to the parity checking type as described above. For example, the ECC engine ECCE may employ a low-density parity code (LDPC) method for checking for and correcting errors by using a soft decision result.

Referring to FIG. 1, the first method for generating the first encoded data EnCD1 and the first decoded data EnDD1 and the second method for generating the second encoded data EnCD2 and the second decoded data EnDD2 may vary with the error correctability of the ECC engine ECCE, for example. For example, the first method may be a method capable of correcting errors with respect to n bits. Meanwhile, the second method may be a method capable of correcting errors with respect to m bits, where m*n.

In response to a control signal XCON transmitted from the ECC control unit ECU, the ECC engine ECCE may set the first method and the second method to be different from each other. In response to a mode signal XMOD, the ECC control unit ECU may configure the control signal XCON. For example, the mode signal XMOD may indicate a first mode, in which the first method and the second method are different from each other, or a second mode, in which the first method and the second method are same as each other. The mode signal XMOD may be either applied from outside or set by default. Alternatively, the mode signal XMOD may be automatically configured according to an operating environment of the flash memory system MSYS.

A logic level of the control signal XCON may correspond to an address of the first memory array MArr1 or the second memory array MArr2 where data is to be programmed. Alternatively, a logic level of the control signal XCON may be a flag indicating to which of the first memory array MArr1 and the second memory array MArr2 memory array data is to be programmed. For example, if data is to be programmed to the first memory array MArr1, which is a cache memory, the control signal XCON may be set to a first logic level based on a cache flag.

Figure 4:
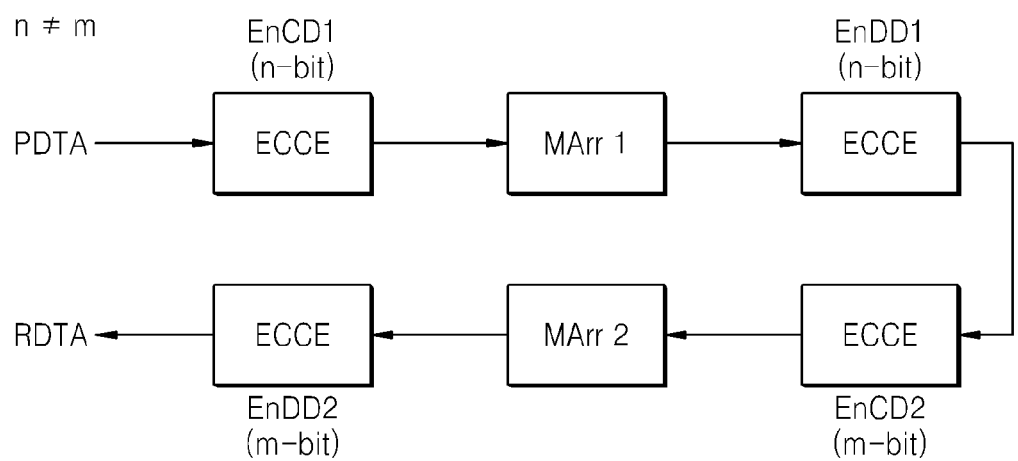
FIG. 4 is a diagram showing a method of checking and correcting errors in the memory system of FIG. 1.

A method of checking for and correcting errors in the flash memory system MSYS according to at least one example embodiment of the inventive concepts may be summarized as shown in FIG. 4. In other words, the program data PDTA is stored in the first memory array Marr1 together with the first encoded data EnCD1 that is generated by encoding the program data PDTA at the ECC engine ECCE. The data stored in the first memory array MArr1 may be moved to the second memory array MArr2. For example, if there is no more storage space in the first memory array MArr1 or it is no longer necessary to access corresponding data, the data stored in the first memory array MArr1 may be moved to the second memory array MArr2. In this case, for checking and correcting possible errors in the data stored in the first memory array MArr1, the ECC engine ECCE compares the first decoded data EnDD1 generated by decoding the first encoded data EnCD1 received from the first memory array MArr1 by using the first method for data received from the first memory array MArr1. As a result of the comparison, if bits of the first decoded data EnDD1 are different from bits of the data received from the first memory array MArr1, errors may be corrected by inversing logic states of the corresponding bits.

The ECC engine ECCE encodes error-corrected data of the first memory array MArr1 by using the second method. Next, when an instruction for reading out data stored in the second memory array MArr2 is received, the ECC engine ECCE compares the second decoded data EnDD2 that is generated by decoding the second encoded data EnCD2 received from the second memory array MArr2 using the second method to data received from the second memory array MArr2. As a result of the comparison, if bits of the second decoded data EnDD2 are different from bits of the data received from the second memory array Marr2, errors may be corrected by inversing logic states of the corresponding bits. The error-corrected data is output as the read-out data RDTA.

As described above, the first method may be a method capable of correcting errors with respect to n bits, whereas the second method may be a method capable of correcting errors with respect to m bits, where m≠n. As shown in FIG. 2, if the first memory array MArr1 is a cache memory and the second memory array MArr2 is a main memory array, n may be less than m. For example, if the flash memory system MSYS is a NAND flash memory system, an ECC method capable of correcting errors with respect to 20 bits may be employed in a cache memory, whereas an ECC method capable of correcting errors with respect to 60 bits may be employed in a main memory array. As described above, the cache memory may be a NAND flash memory that is programmed using a single-level cell method or a memory that may be accessed word by word, and thus, the possibility of errors occurring in the cache memory may be lower than the possibility of errors occurring in the main memory array.

Therefore, according to the method of checking and correcting errors according to at least one example embodiment of the inventive concepts a first memory array for temporarily storing data before the data is programmed to a second memory array is separately arranged. In this case, different error checking and correcting schemes are applied to data stored in the first memory array with relatively low error possibility and data stored in the second memory array with relatively high error possibility. Thus, a speed of error checking and correction may be improved while precision of the error checking and correction is maintained.

Figure 5:
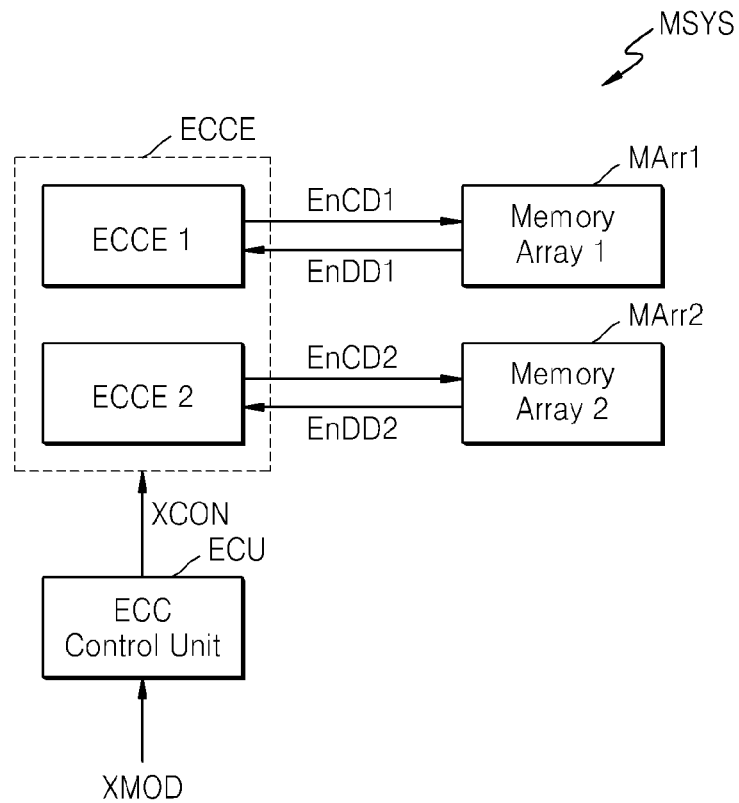
FIG. 5 is a diagram showing a memory system according to at least one example embodiment of the inventive concepts.

FIG. 5 is a diagram showing a memory system according to at least one example embodiment of the inventive concepts.

Referring to FIG. 5, the ECC engine ECCE includes a first sub-engine ECCE1 and a second sub-engine ECCE2. The first sub-engine ECCE1 encodes and decodes data stored in the first memory array MArr1 by using the first method. The second sub-engine ECCE2 encodes and decodes data stored in the second memory array MArr2 by using the second method. Like the ECC engine ECCE shown in FIG. 1, the first sub-engine ECCE1 and the second sub-engine ECCE2 may encode or decode data by using the first method and the second method in response to the control signal XCON. Encoding operations and decoding operations of other sub-engines are same as those of the ECC engine ECCE, and thus detailed description thereof will be omitted.

Figure 6:
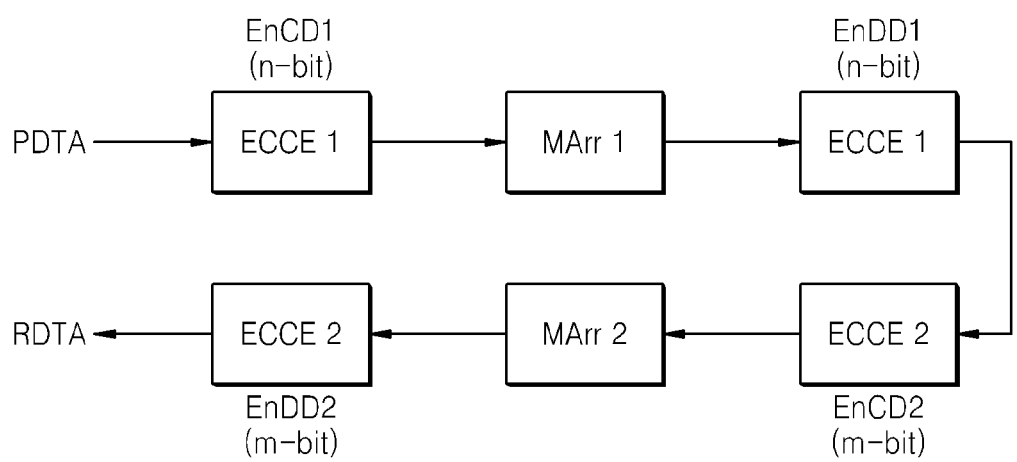
FIGS. 6 and 7 are diagrams showing examples of methods of checking and correcting errors in the memory system of FIG. 5.

Like the flash memory system MSYS of FIG. 1, the flash memory system MSYS of FIG. 5 may sequentially write and read data as shown in FIG. 6. Referring to FIG. 6, the first sub-engine ECCE1 generates the first encoded data EnCD1 by encoding the program data PDTA by using the first method, and for checking for and correcting errors in data read out from the first memory array MArr1, generates the first decoded data EnDD1 by decoding the first encoded data EnCD1 by using the first method. The second sub-engine ECCE2 generates the second encoded data EnCD2 by encoding data, which was stored in the first memory array MArr1 and transmitted to the second sub-engine ECCE2, by using the second method, checks and corrects errors in data read out from the second memory array MArr2 by using the second decoded data EnDD2, which is generated by decoding the second encoded data EnCD2 by using the second method, and outputs the error-corrected data as the read-out data RDTA.

Figure 7:
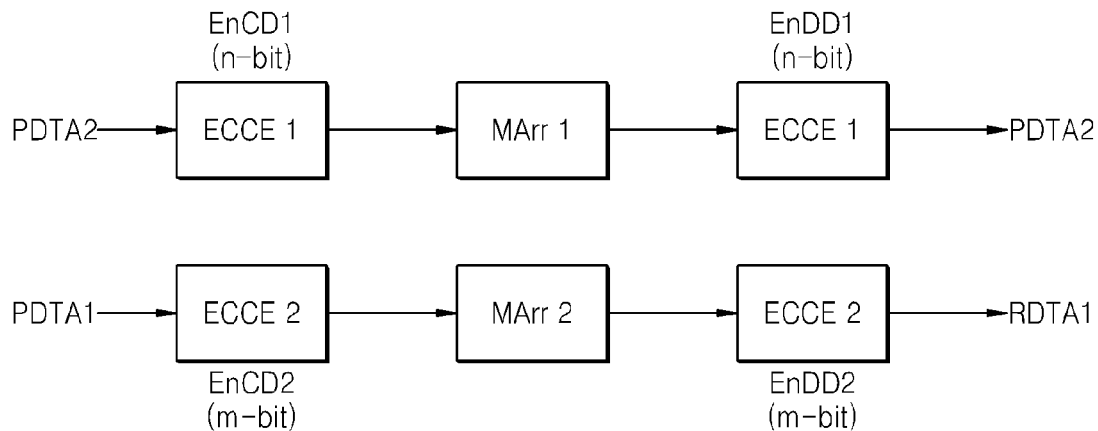

Furthermore, in the flash memory system MSYS of FIG. 5, if the ECC engine ECCE is formed of a plurality of individually operating sub-engines, the error checking and the error correction may be performed in parallel, as shown in FIG. 7. Referring to FIG. 7, while the first sub-engine ECCE1 is encoding or decoding second program data PDTA2 by using the first method, the second sub-engine ECCE2 may encode or decode another program data (e.g., first program data PDTA1) by using the second method. The first program data PDTA1 may be data received by the flash memory system MSYS before the second program data PDTA2 is received. However, the second program data PDTA2 may be data that is either continuous or not continuous to the first program data PDTA1. The second sub-engine ECCE2 outputs the error-checked and corrected first program data PDTA1 as first read-out data RDTA.

As described above, according to the flash memory system MSYS of FIG. 5, error checking and error correction are performed with respect to the first memory array and the second memory array in parallel, and thus, speed of error checking and correction may be increased.

Figure 8:
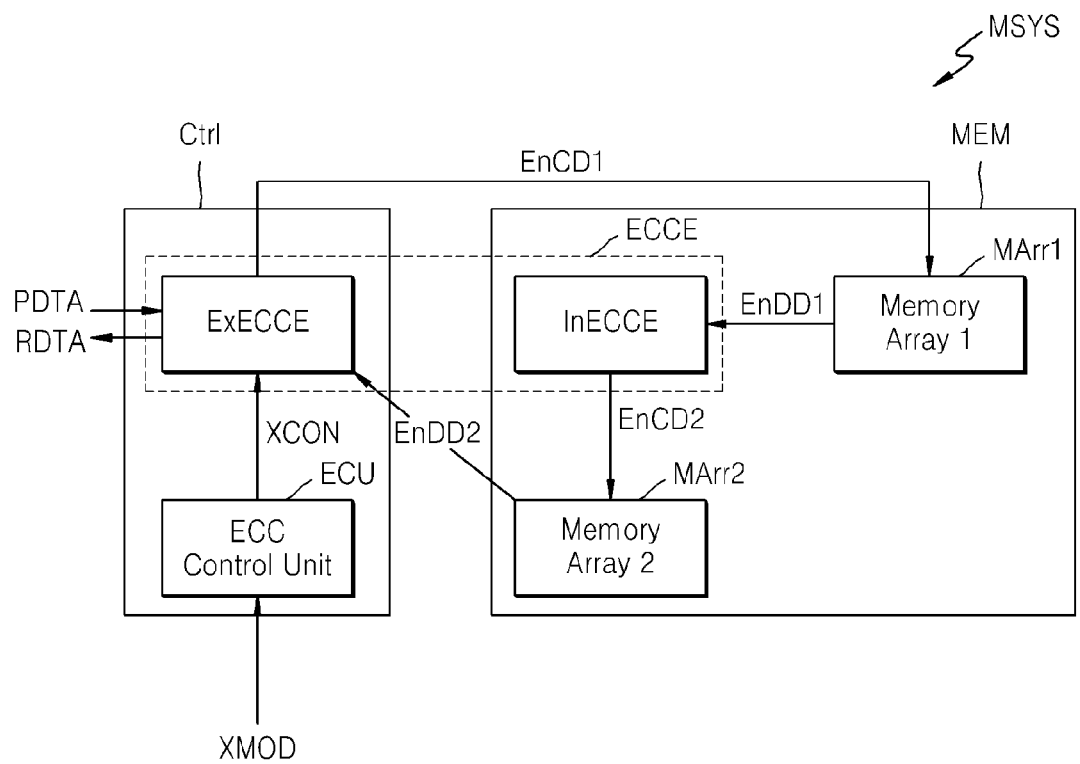
FIG. 8 is a diagram showing a memory system according to at least one example embodiment of the inventive concepts.
Figure 9:
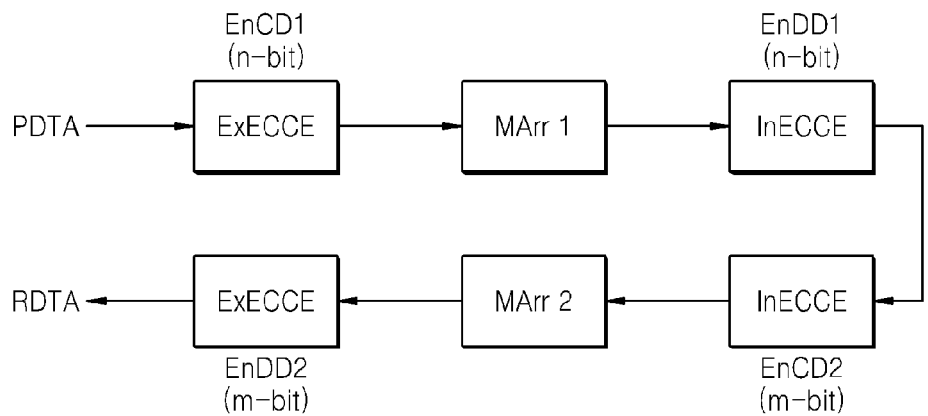
FIG. 9 is a flowchart showing a method of checking and correcting errors in the memory system of FIG. 8.

FIG. 8 is a diagram showing a memory system according to at least one example embodiment of the inventive concepts, and FIG. 9 is a flowchart showing a method of checking and correcting errors in the memory system MSYS of FIG. 8.

Referring to FIG. 8, in the flash memory system MSYS, an ECC engine is included in a memory controller Ctrl and each of memories MEM. The ECC engine included in the memory controller Ctrl is referred to as an external ECC engine ExECCE, whereas the ECC engine included in the memory MEM is referred to as an internal ECC engine InECCE.

The external ECC engine ExECCE generates the first encoded data EnCD1 with respect to the program data PDTA. The internal ECC engine InECCE checks and corrects errors in the program data PDTA read out from the first memory array Marr1 by using the first decoded data EnDD1 that is generated by decoding the first encoded data EnCD1. The internal ECC engine InECCE also generates the second encoded data EnCD2 with respect to the program data PDTA that is read out from the first memory array MArr1 and is error-checked and corrected. If there is a request for reading out the program data PDTA stored in the second memory array MArr2, the external ECC engine ExECCE checks and corrects errors in the program data PDTA read out from the second memory array MArr1 by using the second decoded data EnDD2 that is generated by decoding the second encoded data EnCD2. The external ECC engine ExECCE may check and correct errors in the program data PDTA read out from the second memory array MArr2 and output the error-corrected program data PDTA as the read-out data RDTA.

Figure 10:
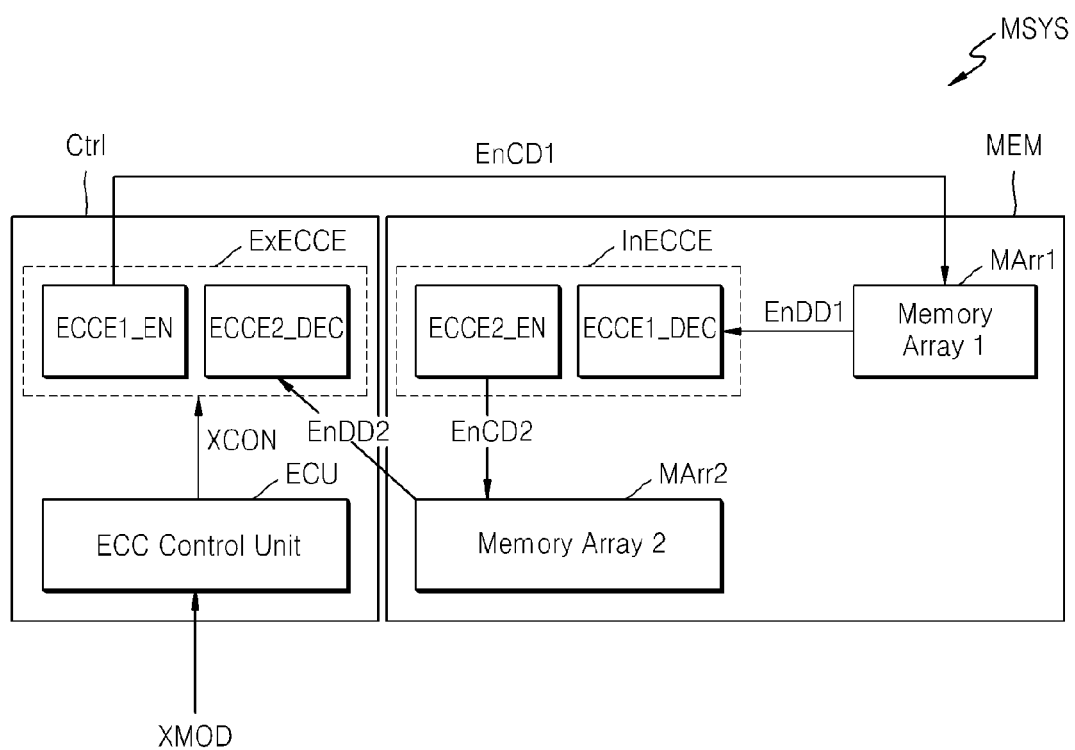
FIG. 10 is a diagram showing a flash memory system according to at least one example embodiment of the inventive concepts.

The external ECC engine ExECCE and the internal ECC engine InECCE of the flash memory system MSYS of FIG. 8 may be configured as shown in FIG. 10. Referring to FIG. 10, the external ECC engine ExECCE may include a first ECC encoder ECCE1_EN and a second ECC decoder ECCE2_DEC. Furthermore, the internal ECC engine InECCE may include a first ECC decoder ECCE1_DEC and a second ECC encoder ECCE2_EN.

Figure 11:
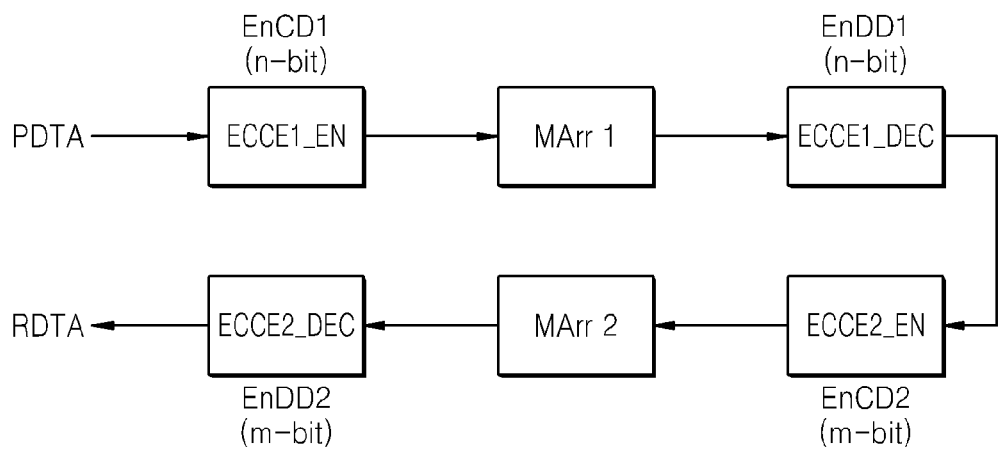
FIGS. 11 and 12 are diagrams showing examples of methods of checking and correcting errors in the memory system of FIG. 10.

The error checking and correction in the flash memory system MSYS of FIG. 10 may be performed by the first ECC encoder ECCE1_EN, the first ECC decoder ECCE1_DEC, the second ECC encoder ECCE2_EN, and the second ECC decoder ECCE2_DEC in the order stated as shown in FIG. 11. In detail, the first ECC encoder ECCE1_EN generates the first encoded data EnCD1 with respect to the program data. PDTA. The first ECC decoder ECCE1_DEC checks and corrects errors in the program data PDTA read out from the first memory array MArr1 by using the first decoded data EnDD1 that is generated by decoding the first encoded data EnCD1. The second ECC encoder ECCE2_EN generates the second encoded data EnCD2 with respect to the program data PDTA that is error-checked and corrected and read out from the first memory array MArr1. If there is a request for reading out the program data PDTA stored in the second memory array MArr2, the second ECC decoder ECCE2_DEC checks and corrects errors in the program data PDTA read out from the second memory array MArr1 by using the second decoded data EnDD2 that is generated by decoding the second encoded data EnCD2

Figure 12:
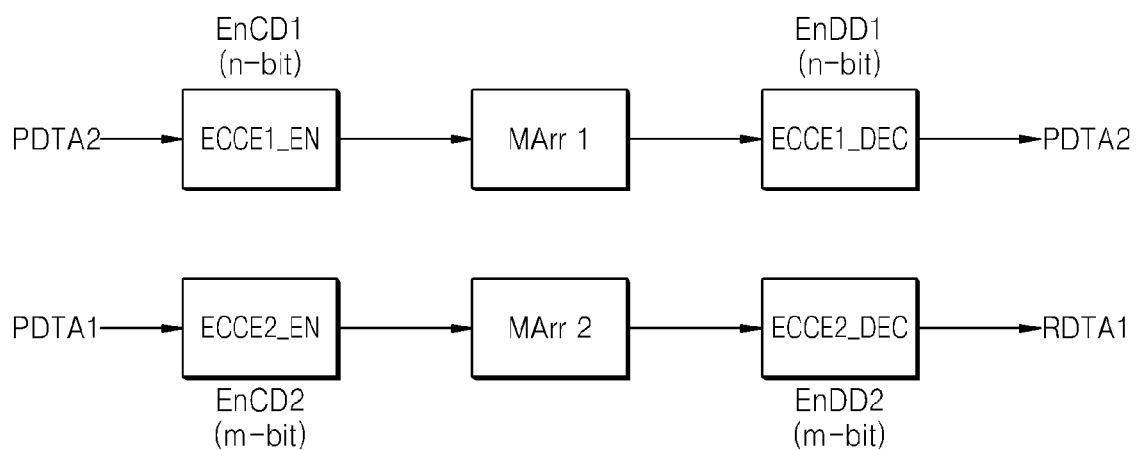

According to the method of checking for and correcting errors in the flash memory system MSYS of FIG. 12, the first ECC encoder ECCE1_EN and the first ECC decoder ECCE1_DEC may operate in parallel with the second ECC encoder ECCE2_EN and the second ECC decoder ECCE2_DEC. In detail, the first ECC encoder ECCE1_EN may generate the first encoded data EnCD1 with respect to the second program data PDTA2 or may check and correct errors in the program data PDTA read out from the first memory array MArr1 by using the first decoded data EnDD1 that is generated by decoding the first encoded data EnCD1. At the same time as encoding or decoding operation of the first ECC encoder ECCE1_EN, the second ECC encoder ECCE2_EN may generate the second encoded data EnCD2 with respect to the first program data PDTA1 or may check and correct errors in the program data PDTA read out from the second memory array MArr2 by using the second decoded data EnDD2 that is generated by decoding the second encoded data EnCD2.

As described above, the first memory array MArr1 may store data therein by using a method with a relatively low error possibility as compared to the second memory array MArr2. Therefore, complexity of a logic for decoding data read out from the first memory array MArr1 and encoding the data read out from the first memory array MArr1 to store the data in the second memory array MArr2 may be reduced.

In this case, as shown in FIG. 8 or FIG. 10, an ECC engine for decoding data read out from the first memory array MArr1 and encoding the data read out from the first memory array MArr1 to store the data in the second memory array MArr2 may be arranged in the memory MEM. Therefore, in a memory system according to an example embodiment of the inventive concepts, error checking and correcting efficiency may be improved by reducing a number of data transmission and reception operations between a controller and a memory, and thus, performance of the memory system may be improved. Furthermore, by arranging only the second ECC encoder ECCE2_EN, which features the same performance and low complexity as compared to the second ECC decoder ECCE2_DEC, in the memory MEM and arranging the second ECC decoder ECCE2_DEC, which features relatively high complexity, outside the memory MEM, a layout size of the memory MEM may be reduced.

An example in which the first method for encoding and decoding with respect to the first memory array is different from the second method for encoding and decoding with respect to the second memory array has been described above. However, the inventive concepts are not limited thereto. In a memory system according to another example embodiment of the inventive concepts, the first method and the second method may be the same method as used in a particular environment. A detailed description thereof will be given below.

Figure 13:
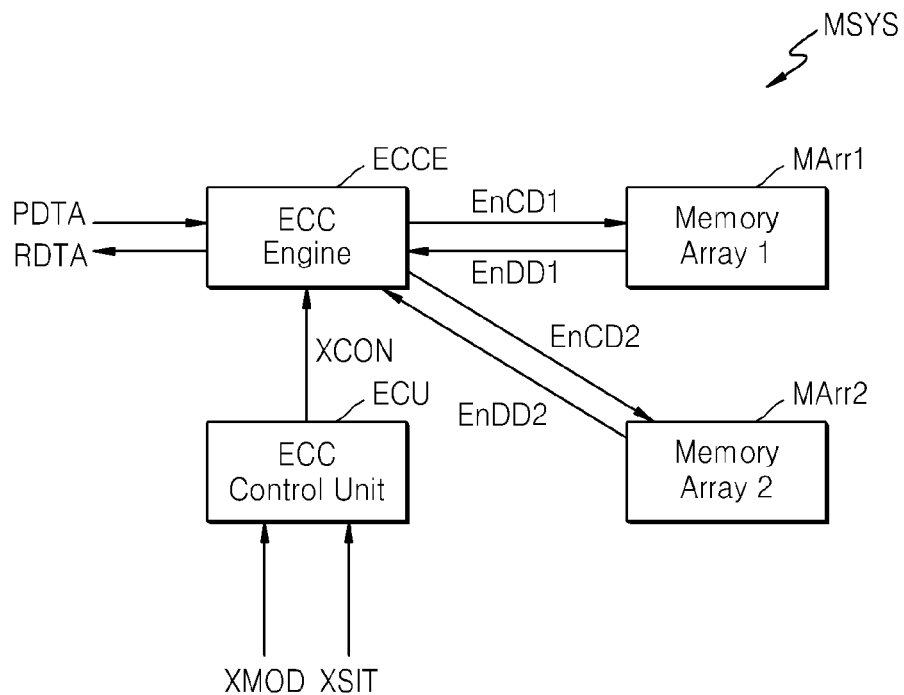
FIG. 13 is a diagram showing a flash memory system according to at least one example embodiment of the inventive concepts.

FIG. 13 is a diagram showing a memory system according to at least one example embodiment of the inventive concepts.

Referring to FIG. 13, the ECC control unit ECU of the flash memory system MSYS of FIG. 13 may further receive an environment signal XSIT. The environment signal XSIT may include information regarding operating environment of the flash memory system MSYS. For example, the environment signal XSIT may indicate whether a number of program/erase (P/E) cycles is smaller than a first reference value. Alternatively, the environment signal XSIT may indicate whether a bit error rate (BER) is smaller than a second reference value. The first reference value and the second reference value may each be set based on an error characteristic of the flash memory system MSYS.

If the P/E cycle increases, distribution deterioration is generated, and thus, an error possibility may increase. However, if the P/E cycle is small (e.g., during the early usage of the flash memory system MSYS), that is, if P/E cycle is smaller than the first reference value, the actual error possibility may be smaller than the error possibility with respect to the flash memory system MSYS. The same applies to BER, program time, or retention time. The P/E cycle may be counted by a counter (not shown) of the memory controller Ctrl. The counted value of the P/E cycle may be stored in the memory controller Ctrl or may be recorded inside a memory array. BER may be detected as a result of an ECC decoding operation.

In an example embodiment as shown in FIG. 4, ECC encoding and decoding are performed with respect to the first memory array MArr1, which operates on a scheme with relatively low error possibility, by using the first method with relatively low error correctability (i.e., capable of correcting errors with respect to n-bits), whereas ECC encoding and decoding are performed with respect to the second memory array MArr2, which operates on a scheme with relatively high error possibility, by using the second method with relatively high error correctability (i.e., capable of correcting errors with respect to m, where m>n-bits).

Figure 14:
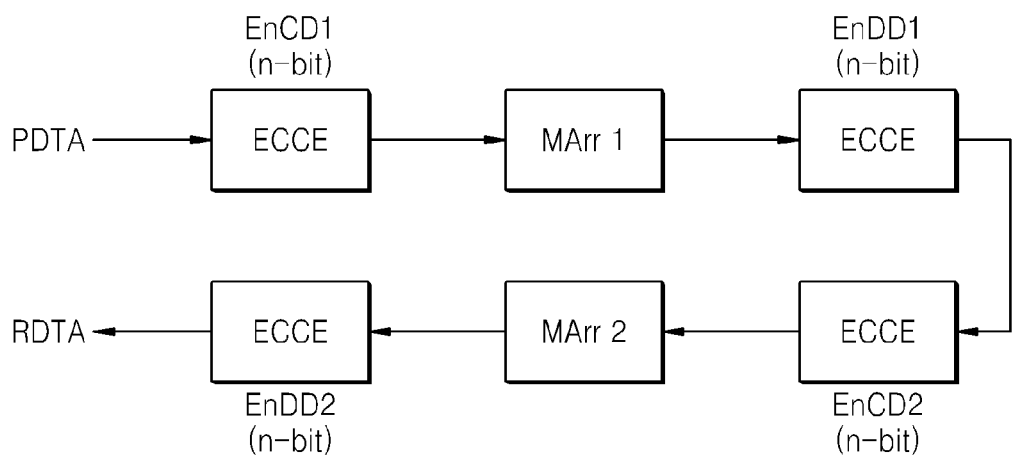
FIGS. 14 and 15 are diagrams showing examples of methods of checking and correcting errors in the memory system of FIG. 13.

However, as shown in FIG. 14 showing an example of a method of checking and correcting errors in the flash memory system MSYS of FIG. 13, if P/E cycle is smaller than the first reference value or BER is smaller than the second reference value, that is, in an operating environment with low error possibility, the ECC encoding/decoding method applied for storing the program data PDTA in the second memory array MArr2 and reading out the read-out data RDTA from the second memory array MArr2 may be same as the first method applied to data with respect to the first memory array MArr1 in FIG. 4. For example, the second encoded data EnCD2 and the second decoded data EnDD2 may be generated via ECC encoding and decoding by using the first method capable of correcting errors with respect to n-bits.

Figure 15:
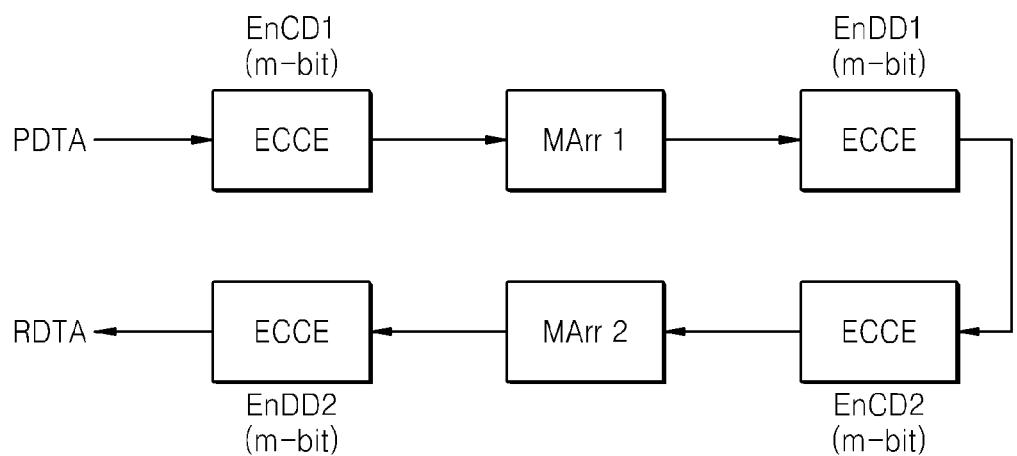

Alternatively, if the P/E cycle is equal to or greater than the first reference value or BER is equal to or greater than the second reference value, that is, in an operating environment with a high error possibility, as shown in FIG. 15 showing another example of methods of checking and correcting errors in the flash memory system MSYS of FIG. 13, the ECC encoding/decoding method applied for storing the program data PDTA in the first memory array MArr1 and reading out the read-out data RDTA from the first memory array MArr1 may be same as the second method applied to data with respect to the second memory array MArr2 in FIG. 4. For example, the first encoded data EnCD1 and the first decoded data EnDD1 may be generated via ECC encoding and decoding by using the second method capable of correcting errors with respect to m-bits.

In the example embodiment shown in FIG. 14 or FIG. 15, a unit for determining a deterioration state of the first memory array MArr1 or the second memory array MArr2 may be any of a number of units, e.g., cells, pages, blocks of the corresponding memory array, the corresponding memory array itself, etc.

A case in which the flash memory system MSYS of FIG. 13 operates in response to the environment signal XSIT has been described above. The flash memory system MSYS of FIG. 13 may also operate in response to the environment signal XSIT and the mode signal XMOD. For example, in response to the mode signal XMOD and the environmental signal XSIT indicating that PIE cycle is smaller than the first reference value or BER is smaller than the second reference value, the ECC control unit ECU may set the first method as the method for ECC encoding and decoding with respect to the first memory array MArr1. On the contrary, even if the mode signal XMOD is activated, if the environmental signal XSIT indicating that PIE cycle is equal to or greater than the first reference value or BER is equal to or greater than the second reference value is received, the ECC control unit ECU may generate the control signal XCON for setting the second method as the method for ECC encoding and decoding with respect to the first memory array MArr1.

The methods of checking for and correcting errors in the flash memory system MSYS of FIG. 13 are not limited to those shown in FIGS. 14 and 15. The ECC engine ECCE of the flash memory system MSYS of FIG. 13 may be same as the ECC engine ECCE of FIG. 5 or FIG. 10. In this case, like in the embodiment shown in FIG. 7 or FIG. 12, a method of checking for and correcting errors in the flash memory system MSYS of FIG. 13, in which ECC encoding and decoding with respect to data stored in the first memory array MArr1 and ECC encoding and decoding with respect to data stored in the second memory array MArr2 are performed in parallel, may be provided.

As described above, as a memory system according to embodiments of the inventive concept employs optimal ECC encoding and decoding methods according to error possibilities, speed of error correction may be increased while maintaining precision of error correction. Therefore, in a memory system according to at least one example embodiment of the inventive concepts, reading speed may be improved while reliability of the memory system is maintained.

Furthermore, if cache programming and ECC are combined, power consumption and latency regarding encoding and decoding of error correcting codes may vary according to error correcting methods. However, since a memory system according to at least one example embodiment of the inventive concepts employs optimal ECC encoding and decoding methods according to error possibilities, power consumption and latency regarding encoding and decoding of error correcting codes may be reduced.

FIGS. 16 through 19 are diagrams showing various examples of first memory arrays and second memory arrays according to at least one example embodiment of the inventive concepts.

Figure 16:
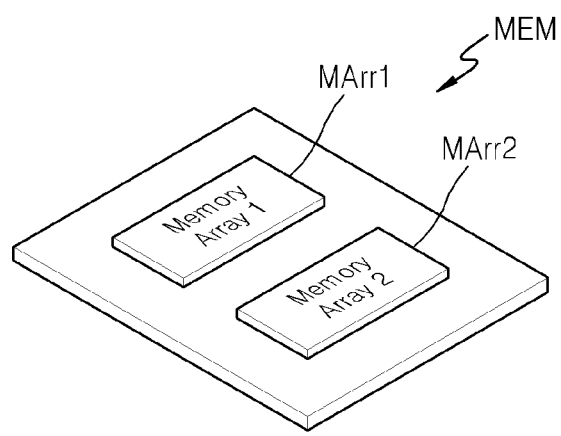
FIGS. 16 through 19E are diagrams showing example embodiments of a first memory array and a second memory array according to at least one example embodiment of the inventive concepts, respectively.

Referring to FIG. 16, the first memory array MArr1 and the second memory array MArr2 included in the memory MEM according to an example embodiment of the inventive concepts may be embodied as different chips on a same layer. The first memory array MArr1 may be embodied as a DRAM, a PRAM, or a single-level cell NAND flash memory.

However, data stored in the first memory array MArr1 according to at least one example embodiment of the inventive concepts are not limited to single-level program data. For example, 2-bit MLC program data may be stored in the first memory array MArr1, and 3-bit or higher bit MLC program data may be stored in the second memory array MArr2.

Furthermore, as described above, the first memory array MArr1 and the second memory array MArr2 may be embodied as different blocks in a flash memory. Alternatively, the first memory array MArr1 and the second memory array MArr2 may be embodied as units to which different voltages are applied or units connected to different common source lines.

Figure 17A:
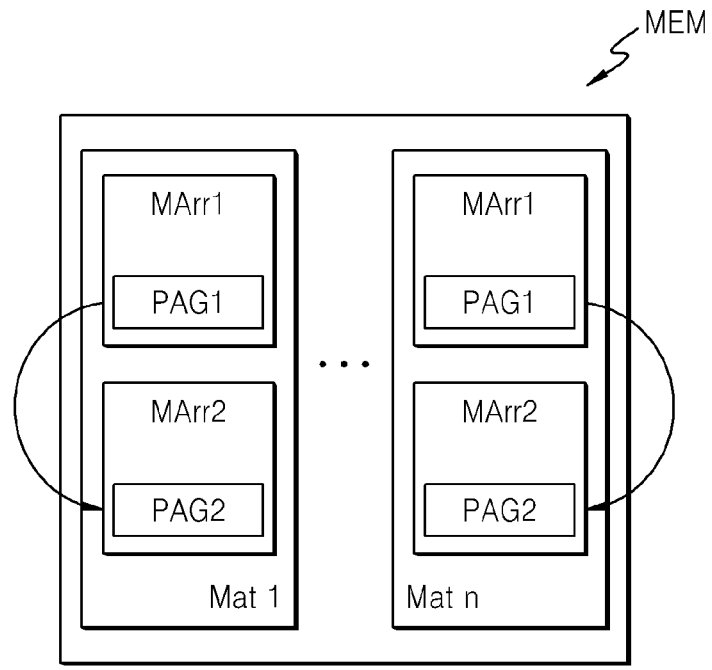

Referring to FIG. 17A, the memory MEM may include a plurality of planes. FIG. 17A shows an example in which n planes Mat1 through Matn are arranged. In FIG. 17A, the first memory array MArr1 and the second memory array MArr2 are arranged on each of the planes Mat1 through Matn. Furthermore, the first memory array MArr1 of each plane functions as a cache memory with respect to the second memory array MArr2 on the same plane. For example, a page PAG1 of the first memory array Marr1 of the first plane Mat1 may correspond to a page PAG2 of the second memory array Marr2 of the first plane Mat1. The caching with respect to a memory array on a same plane as shown in FIG. 17A may be referred to as intra-mat caching.

Figure 17B:
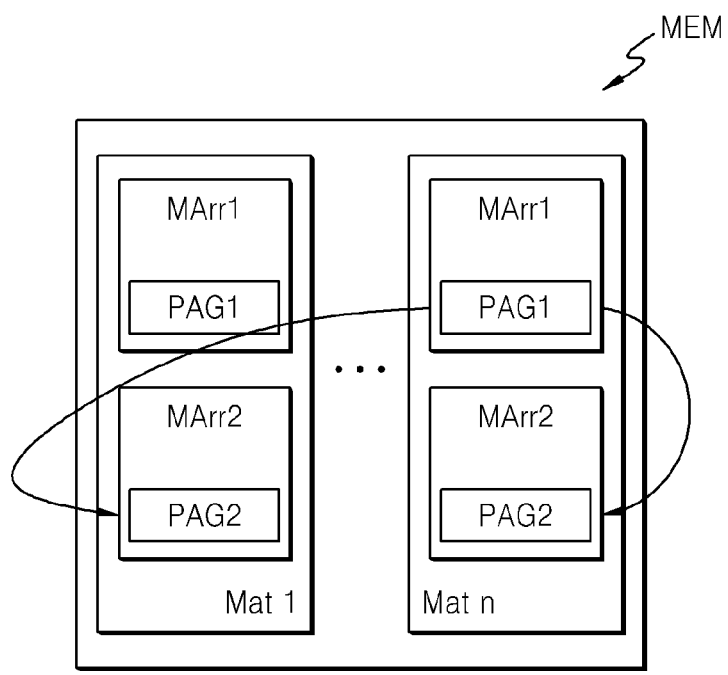

On the contrary, referring to FIG. 17B, the first memory array MArr1 of each plane may not only function as a cache memory with respect to the second memory array MArr2 on the same plane, but also function as a cache memory with respect to the second memory array Marr2 on another plane. For example, the page PAG1 of the first memory array MArr1 on the nth plane Matn may correspond to the page PAG2 of the second memory array Marr2 of the nth plane Matn, or may correspond to the page PAG2 of the second memory array Marr2 on the first page Mat1. The caching with respect to a memory array on another plane as shown in FIG. 17B may be referred to as inter-mat caching.

Figure 17C:
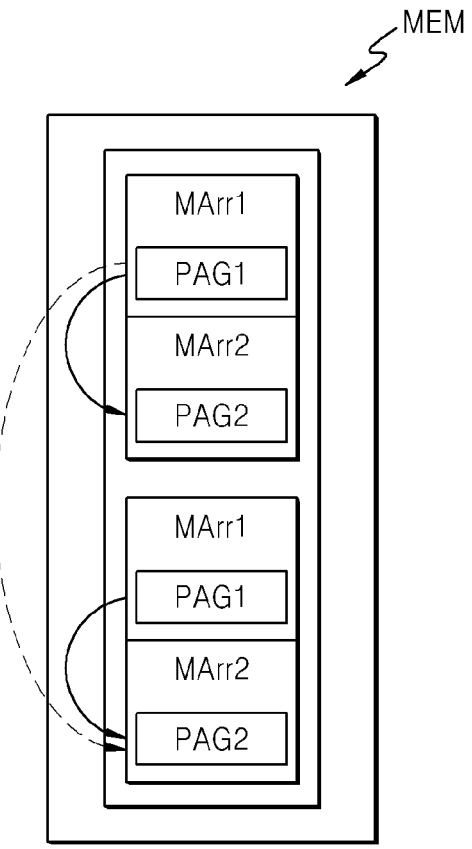

FIG. 17C shows an example of the memory MEM, in which a plurality of blocks, each of which includes the first memory array Marr1 and the second memory array Marr2 on a same plane, are arranged. As described above, the first memory array MArr1 may be a cache memory with respect to the second memory array MArr2, and FIG. 17C shows an example in which each of main blocks includes a cache memory.

The solid line in FIG. 17C indicates that the first memory array Marr1 of each block functions as a cache memory with respect to the second memory array Marr2 of the same block. For example, the page PAG1 of the first memory array Marr1 of an arbitrary block may correspond to the page PAG2 of the second memory array Marr2 of the same block. The caching with respect to a memory array of a same block may be referred to as intra-block caching.

The dotted line in FIG. 17C indicates that the first memory array MArr1 of each block may function as a cache memory with respect to the memory array Marr2 included of another block. For example, the page PAG1 of the first memory array Marr1 of a first block may correspond to the page PAG2 of the second memory array Marr2 of a second block. The caching with respect to a memory array of a different block may be referred to as inter-block caching.

Figure 18:
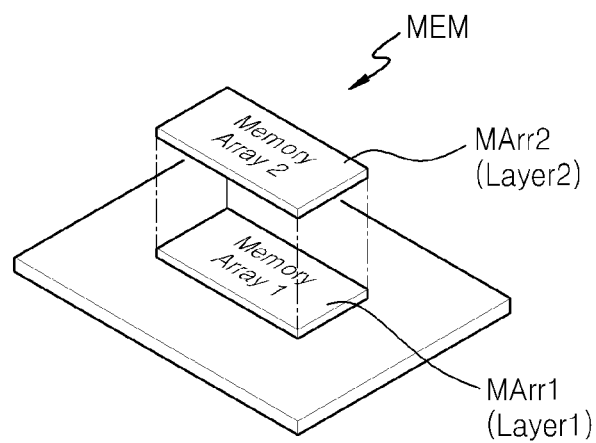

Referring to FIG. 18, the first memory array MArr1 and the second memory array MArr2 included in the memory MEM may be arranged on different layers. For example, the first memory array MArr1 may be arranged on the first layer Layer1, whereas the second memory array MArr2 may be arranged on the second layer Layer2. However, the inventive concepts are not limited thereto. For example, unlike in FIG. 18, the first memory array MArr1 may be arranged on the second layer Layer2, whereas the second memory array MArr2 may be arranged on the first layer Layer1.

Figure 19A:
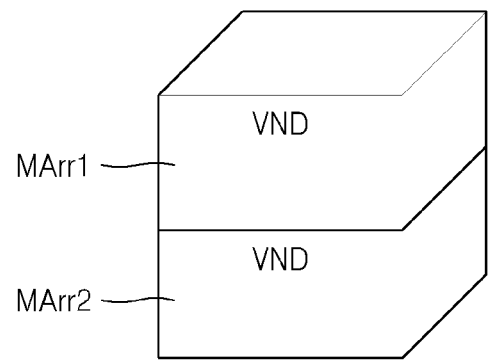
Figure 19B:
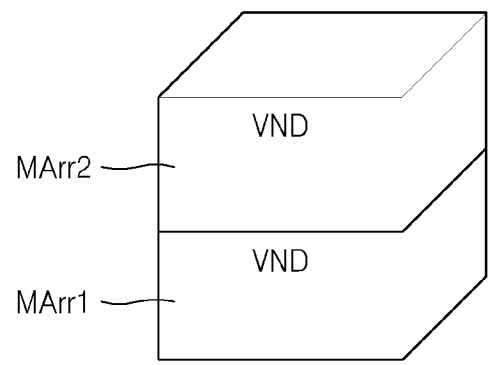
Figure 19C:
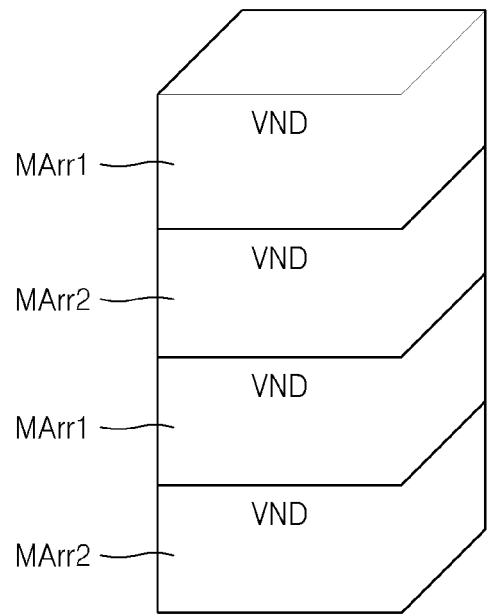

Referring to FIGS. 19A through 19E, the first memory array MArr1 and the second memory array MArr2 included in the memory MEM may be vertical NAND flash memories (VND). In this case, as shown in FIG. 19A, the first memory array MArr1 is arranged above the second memory array MArr2 or the second memory array MArr2 is arranged above the first memory array MArr1. Furthermore, the first memory array MArr1 and the second memory array MArr2 may be alternately stacked as shown in FIG. 19C. As described above, the first memory array MArr1 may be a cache memory, whereas the second memory array MArr2 may be a main memory array.

Figure 19D:
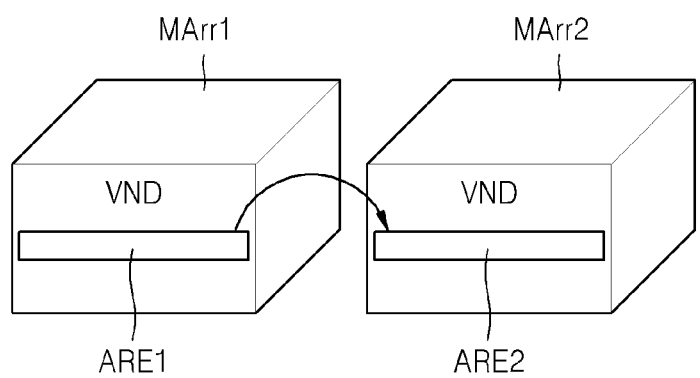
Figure 19E:
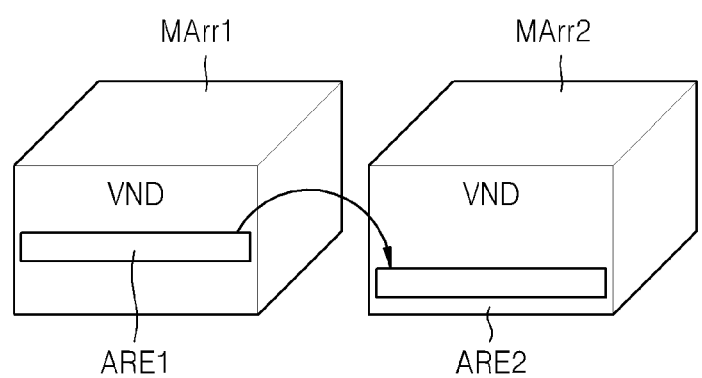

FIGS. 19A through 19C show examples in which the first memory array MArr1 and the second memory array MArr2 are arranged in a same footprinted area on different layers. However, the first memory array MArr1 and the second memory array MArr2 according to at least one example embodiment of the inventive concepts, which are VNDs, may be arranged in different footprinted areas as shown in FIGS. 19D and 19E. FIG. 19D shows an example in which a first area ARE1 of the first memory array MArr1 performs caching with respect to a second area ARE2 of the second memory array MArr2 arranged in a different footprinted area, where the first area ARE1 and the second area ARE2 are arranged on a same layer. On the contrary, FIG. 19E shows an example in which the first area ARE1 of the first memory array MArr1 performs caching with respect to the second area ARE2 of the second memory array MArr2 arranged in a different footprinted area, where the first area ARE1 and the second area ARE2 are arranged on different layers.

A charge trap flash (CTF) based vertical NAND memory features small distribution deterioration due to P/E cycle. Therefore, distribution deterioration of the first memory array MArr1 is small even if the first memory array MArr1 is frequently programmed and read, and thus, even if error checking and correction are performed on data of the first memory array MArr1 by using a method capable of correcting errors with respect to a relatively small number of bits, reliability of data may not be deteriorated. Furthermore, by checking and correcting errors by using a method capable of correcting errors with respect to a relatively small number of bits, speed of checking and correcting errors may be improved and a layout area of a logic for checking for and correcting errors may be reduced.

Figure 20:
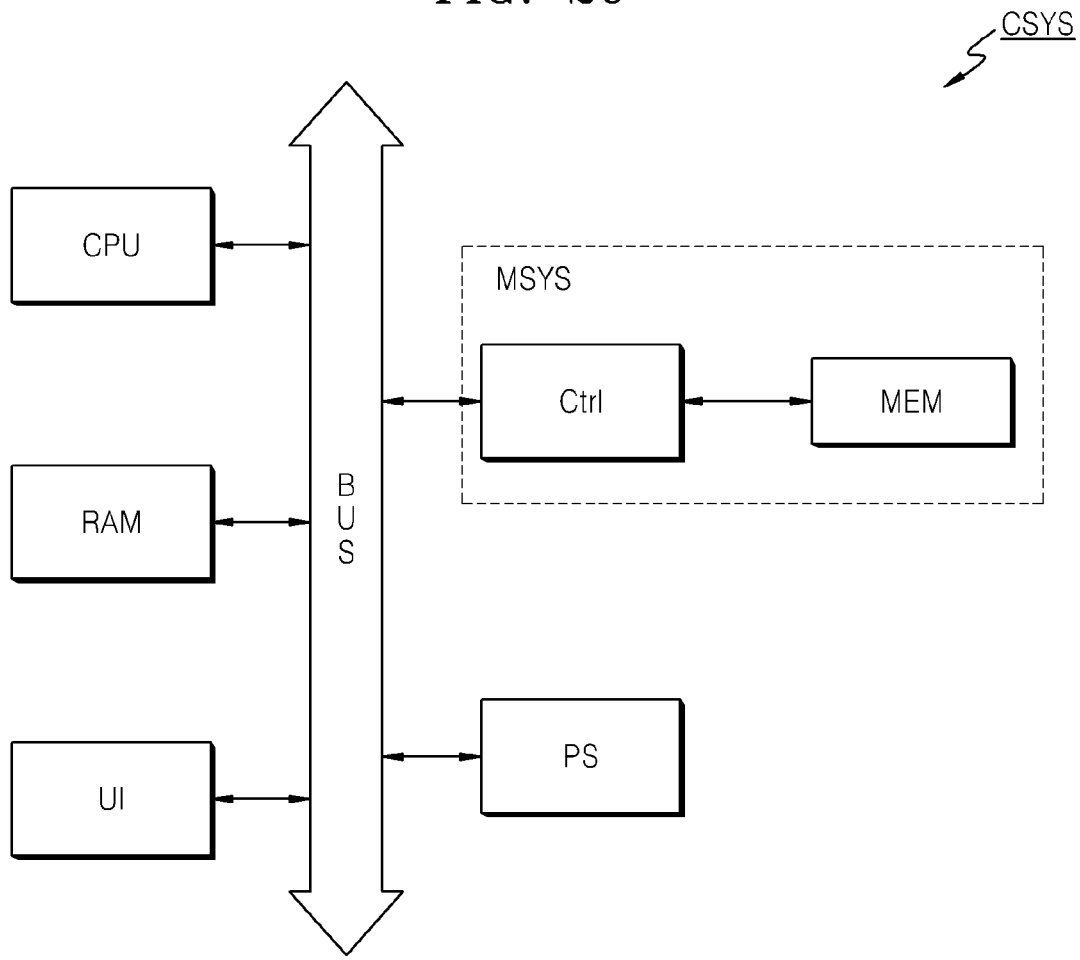
FIG. 20 is a block diagram of a computer system according to at least one example embodiment of the inventive concepts.

FIG. 20 is a block diagram of a computer system CSYS according to at least one example embodiment of the inventive concepts.

The computer system CSYS includes a processor CPU, a user interface UI, and the flash memory system MSYS that are electrically connected to a bus BUS. The flash memory system MSYS includes the memory controller Ctrl and the flash memory MEM. N-bit data (N is an integer equal to or greater than 1) processed or to be processed by the processor CPU is stored in the flash memory MEM via the memory controller Ctrl. The flash memory MEM of FIG. 20 may be the same as that shown in FIG. 3. Therefore, optimal error checking and correction may be performed via the computer system CSYS.

The computer system CSYS according to at least one example embodiment of the inventive concepts may further include a power supply PS. Furthermore, the computer system CSYS may further include a volatile memory device (e.g., RAM).

If the computer system CSYS is a mobile device, a battery for providing power for operating the mobile device and a modem, such as a baseband chipset, may be further provided. Furthermore, it should be understood that the computing system CSYS may further include an application chipset, a camera image processor (CIS), a mobile DRAM, etc., and thus detailed description thereof will be omitted.

Figure 21:
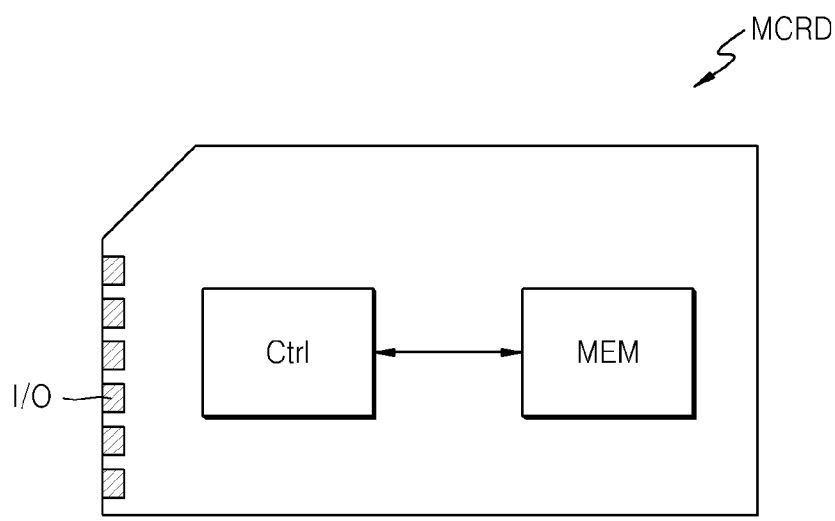
FIG. 21 is a block diagram of a memory card according to at least one example embodiment of the inventive concepts.

FIG. 21 is a block diagram of a memory card MCRD according to at least one example embodiment of the inventive concepts.

Referring to FIG. 21, the memory card MCRD includes the memory controller Ctrl and the flash memory MEM. In response to a request of an external host (not shown) received via an input/output unit I/O, the memory controller Ctrl controls writing data to the flash memory MEM or reading data from the flash memory MEM. Furthermore, the memory controller Ctrl controls deleting with respect to the flash memory MEM. The memory controller Ctrl of the memory card MCRD may include interface units (not shown) for interfacing between hosts and the flash memory MEM and a RAM for performing the control operations as described above. The flash memory MEM of the memory card MCRD may be the same as the flash memory MEM of FIG. 3.

The memory card MCRD of FIG. 21 may be embodied as a compact flash card (CFC), a microdrive, a smart media card (SMC), a multimedia card (MMC), a security digital card (SDC), a memory stick, and a USB flash memory drive. Accordingly, optimal error checking and correction may be performed via the memory card MCRD of FIG. 21.

Figure 22:
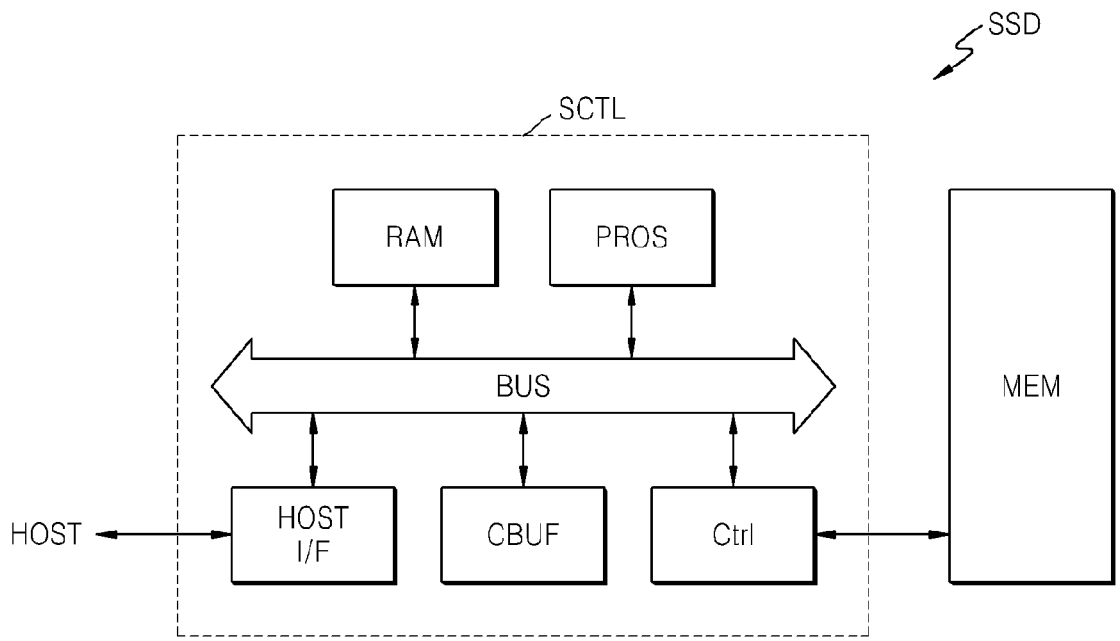
FIG. 22 is a diagram showing a solid state drive according to at least one example embodiment of the inventive concepts.

FIG. 22 is a diagram showing a solid state drive (SSD) according to at least one example embodiment of the inventive concepts.

Referring to FIG. 22, the SSD includes a SSD controller SCTL and the flash memory MEM. The SSD controller SCTL may include a processor PROS, a RAM, a cache buffer CBUF, and the memory controller Ctrl that are interconnected via the bus BUS. In response to a request (instruction, address, or data) of a host (not shown), the processor PROS controls the memory controller Ctrl to transmit and receive data to and from the flash memory MEM. The processor PROS and the memory controller Ctrl of the SSD according to the present embodiment may be embodied as a single ARM processor. Data necessary for operating the processor PROS may be loaded to the RAM.

A host interface HOST I/F receives a request from a host and transmits the request to the processor PROS or transmits data transmitted from the flash memory MEM to the host. The host interface HOST I/F may be any of various interface protocols, such as universal serial bus (USB), man machine communication (MMC), peripheral component interconnect-express (PCI-E), serial advanced technology attachment (SATA), parallel advanced technology attachment (PATA), small computer system interface (SCSI), enhanced small device interface (ESDI), intelligent drive electronics (IDE), etc., for interfacing with a host. Data to be transmitted to the flash memory MEM or transmitted from the flash memory MEM may be temporarily stored in the cache buffer CBUF. The cache buffer CBUF may be a SRAM, for example.

The SSD may include the flash memory MEM of FIG. 3. Therefore, optimal error checking and correction may be performed via the SSD of FIG. 22.

Figure 23:
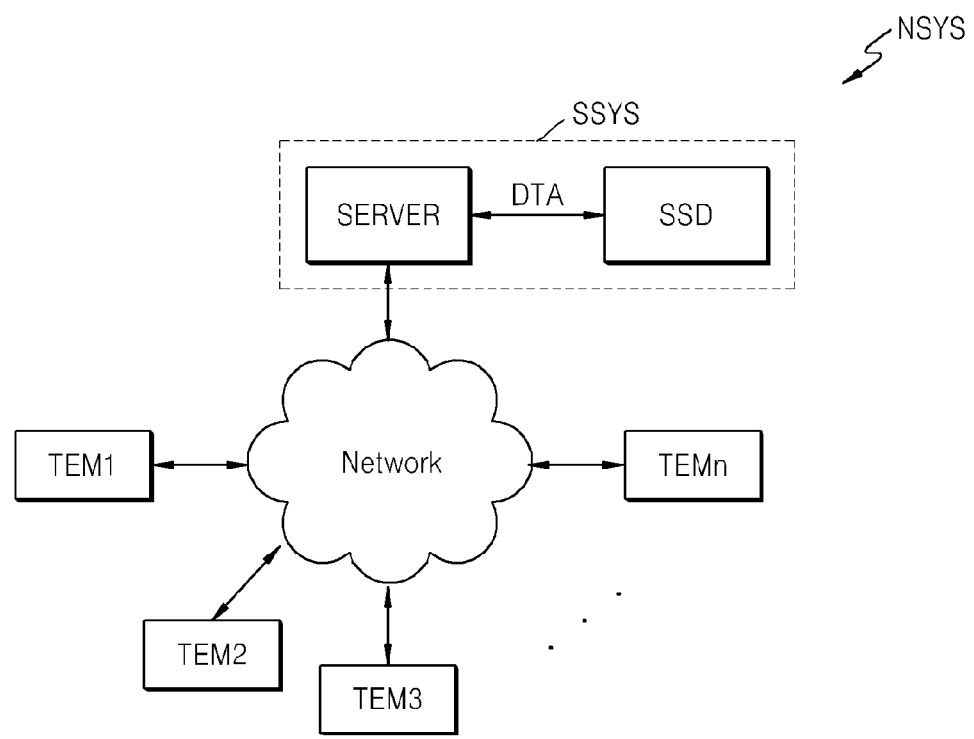
FIG. 23 is a diagram showing a server system including a SSD and a network system.

FIG. 23 is a diagram showing a server system SSYS including a SSD and a network system NSYS.

Referring to FIG. 23, the network system NSYS according to at least one example embodiment may include a server system SSYS and a plurality of terminals TEM1 through TEMn that are connected via a network. The server system SSYS may include a server for processing requests received from the plurality of terminals TEM1 through TEMn connected to the network and a SSD for storing data corresponding to the requests received from the terminals TEM1 through TEMn. Here, the SSD of FIG. 23 may be the same as the SSD of FIG. 22. In other words, the SSD of FIG. 23 may include the SSD controller SCTL and the flash memory MEM, where the flash memory MEM may be a flash memory which performs error checking and correction as shown in FIG. 1.

While the inventive concepts have been particularly shown and described with reference to exemplary embodiments thereof, it will be understood that various changes in form and details may be made therein without departing from the spirit and scope of the following claims.

What is claimed is:

1. A memory system, comprising:
an error checking and correction (ECC) engine configured to perform error checking and correction of data temporarily stored in a first memory array and data read out from the first memory array according to a first method, and perform error checking and correction of data stored in a second memory array after reading out data from the first memory array and data read out from the second memory array according to a second method, wherein
the ECC engine is configured to perform the first method and the second method in response to a control signal having at least a first logic level, and an error correcting capability of the second method is greater than an error correcting capability of the first method; and
an ECC control unit configured to generate the control signal at the first logic level if a value indicating a deterioration state of the first memory array is less than a first reference value, the first logic level of the control signal corresponding to a flag indicating to which of the first memory array and the second memory array memory array data is to be programmed; and
if the value indicating the deterioration state of the first memory array is greater than a second reference value, then the ECC control unit is configured to generate the control signal at a second logic level different from the first logic level, and in response to the second logic level of the control signal, the ECC engine sets the second method to be the same as the first method.

2. The memory system of claim 1, wherein
the ECC engine is configured to check and correct errors of n bits according to the first method, where n is a natural number, and
the ECC engine is configured to check and correct errors with respect to m bits according to the second method, where m is a natural number greater than n.

3. The memory system of claim 1, wherein the ECC engine includes
a first sub-engine configured to check and correct errors of data stored in and read out from the first memory array according to the first method; and
a second sub-engine configured to check and correct errors of data stored in and read out from the second memory array according to the second method.

4. The memory system of claim 3, wherein, while the second sub-engine is configured to perform an ECC encoding of first data to be stored in the second memory array or an ECC decoding of the first data read out from the second memory array, the first sub-engine is configured to perform an ECC encoding of second data to be stored in the first memory array or an ECC decoding of the second data read out from the first memory array.

5. The memory system of claim 1, further comprising:
a memory controller; and
a memory, wherein the ECC engine includes
an external ECC engine in the memory controller, the external ECC engine configured to perform an ECC encoding of data of the first memory array according to the first method and an ECC decoding of data of the second memory array according to the second method; and
an internal ECC engine in the memory, the internal ECC engine configured to perform an ECC decoding of data of the first memory array according to the first method and an ECC encoding of data of the second memory array according to the second method.

6. The memory system of claim 5, wherein design complexity of the internal ECC engine is lower than that of the external ECC engine.

7. The memory system of claim 1, wherein the ECC control unit is configured to determine the deterioration state of the first memory array based on a program/erase (P/E) cycle, retention time, or bit error rate (BER) of the first memory array.

8. The memory system of claim 1, wherein
if a value indicating a deterioration state of the second memory array is greater than a third reference value, the ECC control unit is configured to generate the control signal at a second logic level different from the first logic level, and in response to the second logic level of the control signal, the ECC engine sets the second method to be the same as the first method.

9. The memory system of claim 1, wherein a number of bits of data stored in each of memory cells of the first memory array is less than a number of bits of data stored in each of memory cells of the second memory array.

10. The memory system of claim 1, wherein the first memory array and the second memory array are vertical NAND flash memories.

11. The memory system of claim 1, wherein the first memory array and the second memory array are arranged on a same physical layer or on different physical layers.

12. A NAND flash memory device, comprising:
an internal error checking and correction (ECC) engine configured to perform ECC decoding for checking and correcting errors on data temporarily stored in a first memory array and data read out from the first memory array according to a first method, and perform ECC encoding for checking and correcting errors on data stored in a second memory array after read out from the first memory array and data read out from the second memory array according to a second method,
wherein an error correcting capability of the second method is greater than an error correcting capability of the first method, and the internal ECC engine is configured to perform the first method and the second method in response to a control signal having at least a first logic level; and
an ECC control unit configured to generate the control signal, and if a value indicating a deterioration state of the first memory array is greater than a reference value, then the ECC control unit is configured to generate the control signal at a second logic level different from the first logic level, and in response to the second logic level of the control signal, the ECC engine sets the second method to be the same as the first method.

13. The NAND flash memory device of claim 12, wherein the first memory array and the second memory array are vertical NAND flash memories.

14. A memory system, comprising:
a memory including a first memory array and a second memory array;
an error checking and correction (ECC) engine configured to perform error checking and correction of first data in the first memory array to generate corrected first data, and perform error checking and correction of the corrected first data in the second memory array to generate corrected second data, the ECC engine being configured to output final decoded data based on the corrected second data; and a control unit configured to apply a control signal to the ECC engine to control the ECC engine, the control unit being configured to apply the control signal based on at least one of a mode signal and an environment signal, the mode signal indicating a method of error checking and correction for the first and second data, and the environment signal indicating at least one of whether a number of program/erase (P/E) cycles is less than a first reference value and whether a bit error rate (BER) is less than a second reference value.

15. The memory system of claim 14, wherein the first data is 'n' number of bits and the second data is 'm' number of bits, and if 'm' is greater than 'n,' then the ECC engine is configured to apply different error checking and correction methods for the first data and the second data in response to the control signal.

16. The memory system of claim 15, wherein if 'm' is equal to 'n,' then the control unit is configured to determine error checking and correction methods for the first data and the second data based on the environment signal.

17. The memory system of claim 16, wherein if 'm' is equal to 'n,' then the first data includes a least significant bit of a data line, and the second data includes a most significant bit of the data line.

* * * * *